Figure 2:
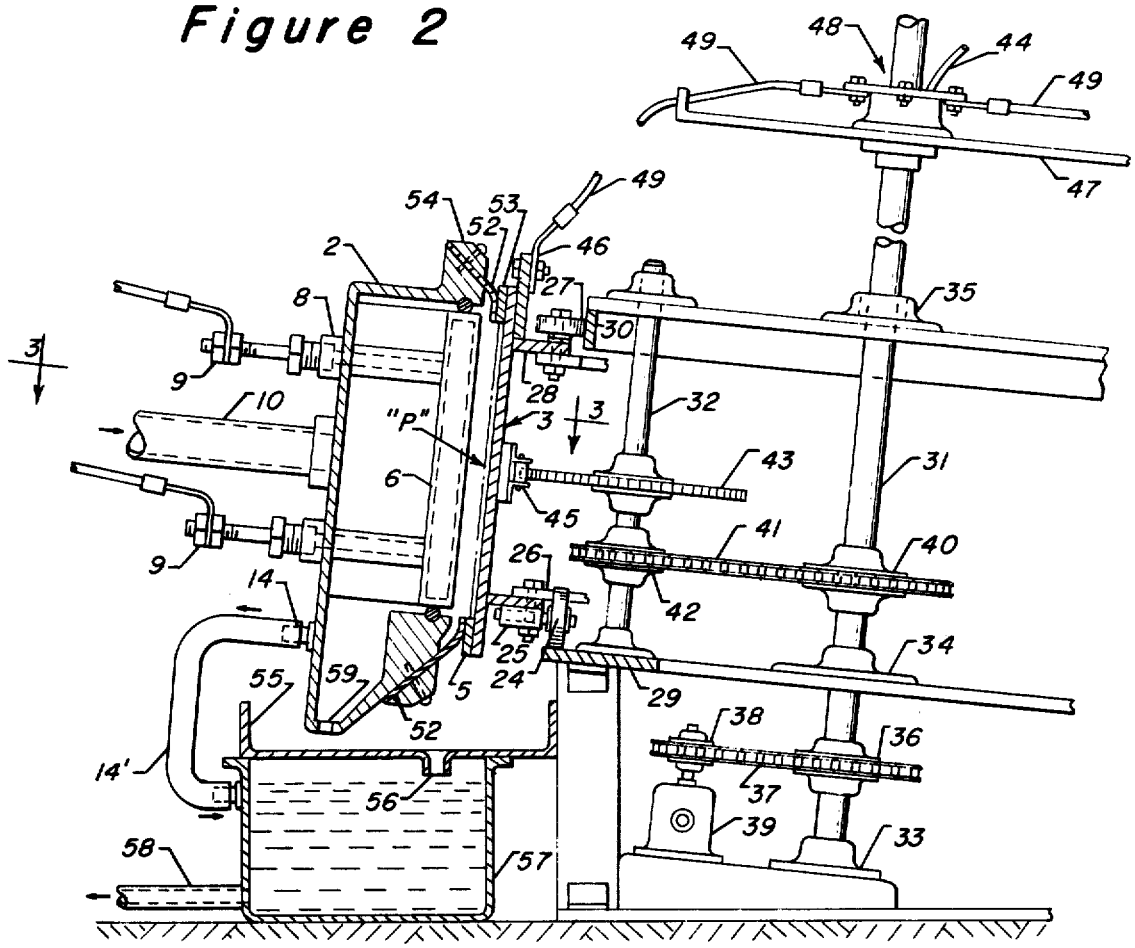

United States Patent [19]

Schaer et al.

[11] 4,003,805
[45] Jan. 18, 1977

[54] SYSTEM FOR ELECTROPLATING A SEQUENCE OF MOVING PLATE MEMBERS

[75] Inventors: Glenn R. Schaer; Harold E. Trumbull, both of Columbus, Ohio

[73] Assignee: UOP Inc., Des Plaines, Ill.

[22] Filed: Oct. 20, 1975

[21] Appl. No.: 624,209

[52] U.S. Cl. .................. 204/27; 204/199; 204/224 R

[51] Int. Cl.² ............. C25D 5/02; C25D 5/26

[58] Field of Search ......... 204/27, 224 R, 198–205, 204/15

[56] References Cited

UNITED STATES PATENTS

| 900,169 | 10/1908 | Hollis | 204/198 |
|---|---|---|---|
| 3,468,782 | 9/1969 | Bovone | 204/198 |
| 3,723,283 | 3/1973 | Johnson et al. | 204/224 R |

FOREIGN PATENTS OR APPLICATIONS

| 26,504 | 11/1913 | United Kingdom | 204/224 R |
|---|---|---|---|
| 323,947 | 1/1930 | United Kingdom | 204/224 R |

*Primary Examiner*—T. M. Tufariello
*Attorney, Agent, or Firm*—James R. Hoatson, Jr.; Philip T. Liggett; William H. Page, II

[57] ABSTRACT

A continuously operating system is provided to convey a sequence of steel plates in a generally vertical positioning to a plating station where a plurality of power supplied interlinked cathode-plate conveyor members are arranged to carry each plate past a vertically elongated plating head which contains an anode and the electroplating solution. The anode is also vertically elongated, and is adjustably positioned in the plating head or container to be relatively close to the face of the steel plate which is being plated but, at the same time, provides a space for the plating solution to have turbulent flow between the anode and the moving plate. A second plating head may be positioned alongside the first to provide for the depositing of a nodular form of copper onto the initial deposit.

10 Claims, 5 Drawing Figures

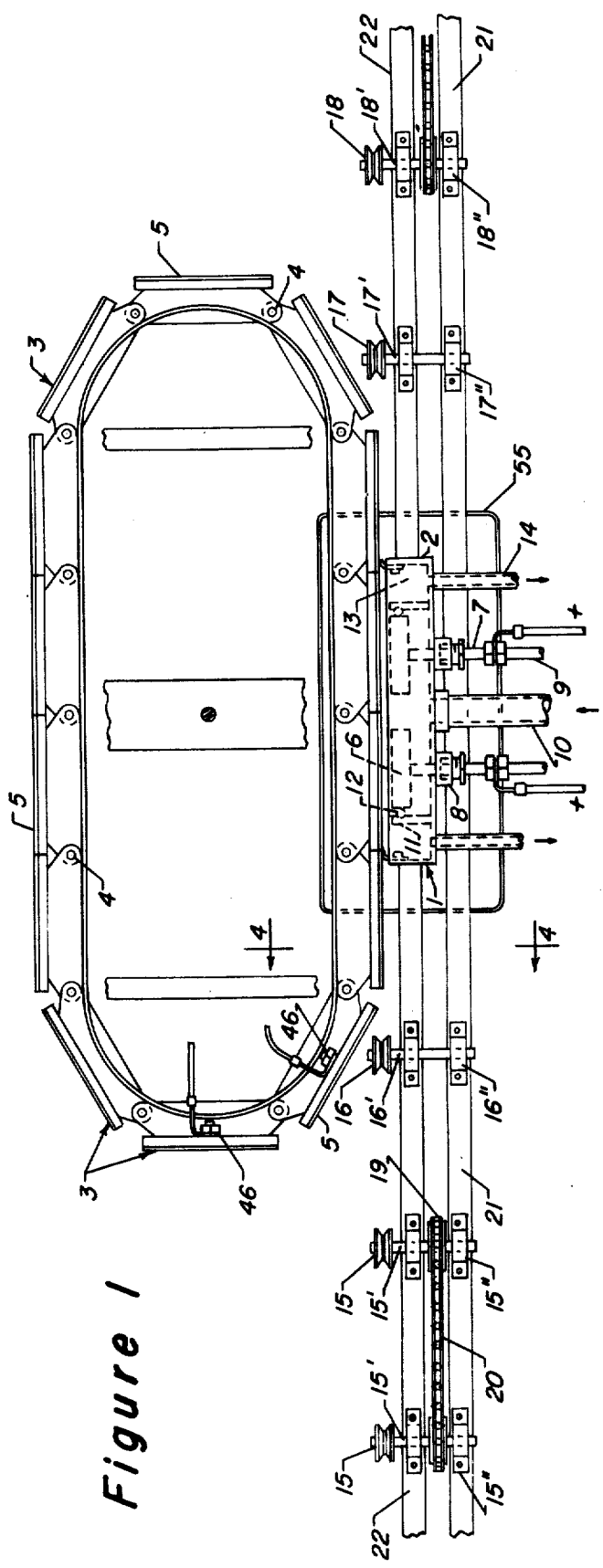
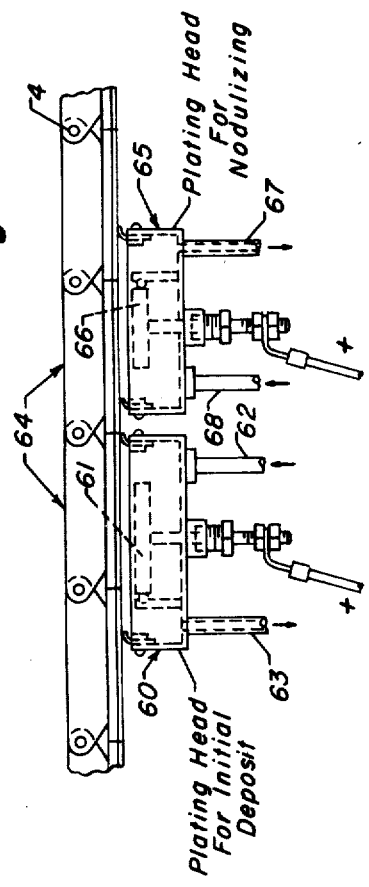
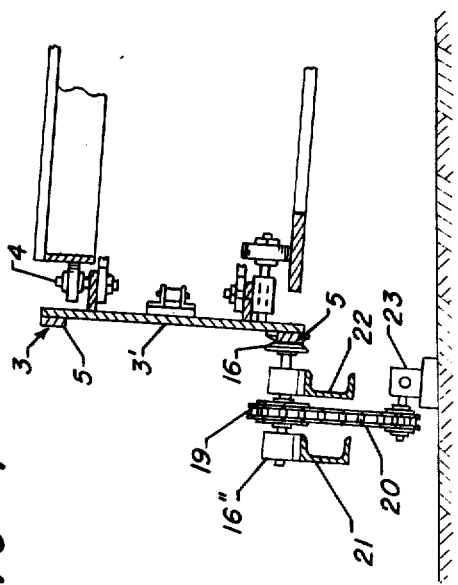

SYSTEM FOR ELECTROPLATING A SEQUENCE OF MOVING PLATE MEMBERS

The present invention relates to a continuously operating electroplating system for effecting the plating of a continuous sequence of moving plate members.

More particularly, the present invention is directed to a method and means for conveying a sequence of steel plate members to and on through a plating station where a plurality of interlinked current carrying cathode members convey the plates past a plating head which maintains a vertically elongated anode to oppose the faces of the moving plate members.

BACKGROUND OF THE INVENTION

In the manufacture of copper-clad laminates, such as used for circuit boards in the electrical field, it has been the typical practice to buy coils of thin copper foil and to provide means to combine a layer onto one or both faces of a laminate board during the manufacturing procedure. For example, the foil may be bonded to a semicured prepreg sheet prior to cutting and stacking with other prepreg sheets in the heat treating and pressing steps. In another method, there may be the integrating and bonding of the metal foil layer onto the laminate board during the final heat treating and pressing steps. In any event, from the aspect of being able to handle thin metal foils, these prior conventional methods of effecting metal-clad laminates have required the use of metal foils that are thicker than might otherwise be required for electrical current conducting reasons. For instance, with copper foils, it has been found difficult to handle a foil that is thinner than about 0.0007 to 0.0012 inches in thickness, although relatively thin coatings, having a thickness of from only about 0.0002 inches to about 0.0004 inches, may well be used as a conductor for a laminate circuit board.

In addition, it has become known that a thin film of conductive metal may be applied to a metal carrier sheet and then transferred from the latter to a laminate board. For example, a thin copper coating on a stainless steel press plate (caul plate) can be transferred to the face of an epoxy or resin impregnated fiber glass laminate sheet, typically referred to as a prepreg sheet. By way of explanation, in laminate board manufacture, a plurality of prepreg sheets are stacked together and then pressed and heated in a final treating operation to produce a desired stage of curing and a resulting rigid form of laminate board. The number of sheets used will, of course, vary in accordance with the desired thickness for the finished laminate board. For conductive laminate board, copper and other conductive metal will be pressed and bonded to one or both faces of a stack of sheets to result in providing copper cladding to one face or to both faces of the finished laminate type circuit board. In any event, in the use of plated caul sheets, such as will result from the use of the continuous system of the present invention, a caul sheet with a thin removable metal coating on one side can be used on the top or bottom of a pressing operation to provide a film transfer to one face of a resulting laminate board. Also, a caul plate with depositions on both sides may well be used in the middle of a stack of prepreg sheets, along with a coated plate at the other face of a stack, such that copper coatings can be imparted to both sides of a laminate board.

SUMMARY OF THE INVENTION

In this instance, it may be considered an object of the present invention to provide for a system that will continuously and automatically carry out the electrodeposition of copper onto a sequence of steel plates, such as "caul" plates which will be used in the pressing of prepreg sheets in the forming of rigid laminate board.

It is also an object of the present invention to provide a special apparatus arrangement adapted to move a sequence of plates past a fixed position plating head to effect the continuous plating of a vertical strip of plate, as the plates are conveyed past the plating head and between current supplying electrodes.

In one embodiment, the invention provides a continuous automatic method for effecting the plating of a thin copper coating onto a steel plate, which comprises the steps of: (a) conveying a cleaned steel plate in a generally vertical position to a plating station and transferring such plate to movable generally vertical cathode-conveyor means providing a current conducting face for supplying electrical current to the back side of said plate as it passes the plating station, (b) supplying a copper containing electrolyte solution into contact with a vertical strip portion of said steel plate from a containment zone with an open portion maintained against the face of the moving plate to be coated while simultaneously supplying electric current to said cathode-conveyor means and to an anode means positioned to be maintained closely adjacent substantially the full height of a strip of the front face of the steel plate from within said electrolyte containment zone, (c) with said supply of electrolyte solution to said containment zone and the withdrawal of solution therefrom providing turbulent electrolyte flow between the spaced faces of the anode and the steel plate during the plating operations, and (d) continuously withdrawing and conveying away the resulting copper coated steel plates as they are passed by the anode means and leave the plating station.

In another embodiment the present invention provides an apparatus for effecting a copper plating to one side of a sequence of separate stainless steel plates, which comprises in combination, (a) conveyor means for holding the plates to be coated in a generally vertical position and for sequentially conveying separate plates to and from a plating station, (b) a plurality of separate cathode-plate conveyor members that are interlinked to form an endless loop of members that are movably mounted on a track means so as to be continuously movable in generally vertical positioning around a loop path opposing said plating station, with each cathode-plate conveyor member having at least a lower projecting support means to support and move said plates as they reach the plating station and, additionally, having an electrically conductive surface to be in contact with the back portion of the plate being plated, and to conduct electric current thereto, (c) motive power means connective to said interlinked cathode-plate conveyor members to move them on said track means, (d) a box-like plating head with an open side portion to face the conveyed plates and distribute electrolyte into contact with one face thereof, said plating head also encompassing a vertically elongated anode therein that is positioned to be maintained at a spaced distance from a vertical strip portion of each steel plate as it is sequentially conveyed by said station, and said plating head further having at least upper and lower liquid holding seal means to preclude the loss of the electrolyte along the upper and lower edges of the moving plates as they move past the plating head, (e) electrolyte distributing means to said plating head to supply plating solution to said plating station and into contact with each plate between said anode means and the plate as it is being moved past said head, (f) electrolyte solution withdrawal means from said head, (g) electrolyte solution collection means positioned below said plating station to collect electrolyte flows and leakages from around said plating head, and (h) current supplying electrode means connective with the anode means in the interior of said plating head and with each of the plurality of movable cathode-plate conveyor members whereby electric plating current can be supplied to the solution and to each steel plate as it passes the plating head for rapidly effecting a desired thin copper plating to one side of each such plate.

In a preferred system, provision is provided for varying the flow rate of the electrolyte or plating solution through the plating head as well as provision made for adjusting the electrical energy input to the electrodes of the unit. Preferably, the flow rate of the plating solution will be maintained relatively high between the face of the anode and the face of the steel plate which is undergoing plating in order that there will be a relatively smooth initial coating to the plate surface. Also, a preferred arrangement will make provision for the adjustability of the positioning of the anode with respect to the face of the plate being coated in order that the flow rate of the solution may in turn be regulated in the resulting space between the anode and the face of the plate. Still further, a variable current control arrangement should be provided with respect to the current input to the spaced electrodes so that varying current intensity can be provided for the electroplating operation. For example, suitable rheostat means will be provided to regulate the wattage or current being supplied between the electrodes such that the energy input can be varied from within a range of about 5 amperes per square inch to about 25 amperes per inch.

The anode is maintained within the plating head and is of a length sufficient to extend for the full height of a plate member being conveyed past the plating head such that a vertical strip, or band, of copper will be applied to the full vertical height of the steel plate as it moves past the plating head. Various types of anode constructions and materials may be incorporated in the improved system; however, the material should be of a type which is resistant to the plating bath and to the plating conditions. For example, in connection with the electrodepositions of copper onto stainless steel plates, the vertical anode may comprise a copper core encompassed within a lead sheath.

In connection with the present apparatus, there will be a plurality of cathode members interlinked one to another in a belt arrangement, with such members being of a height and of an extended area size that they are capable of carrying the sequence of plate members which are to undergo the plating operation. In addition, each cathode-conveyor member will have a suitable lower ledge capable of receiving and supporting the plate member by the lower edge as it is passed in a substantially vertical position past the plating station. Also, each cathode-conveyor will have a flat plate holding surface capable of transmitting current to the entire surface of the plate member as it is conveyed past the plating station. Typically, the pressure of the circulating plating solution in the plating head will provide a small superatmospheric pressure against the entire vertical strip portion of the plate member passing the plating head and cause such plate to be pushed against the cathode-conveyor member. Actually, the cathode, or cathodes, which will be distributing current to the back side of the plate member need not have an unbroken, smooth surface, as long as the surface from an overall aspect is sufficiently smooth and flat as to be capable of transmitting uniform distribution of current to the back side of the conveyed plate. Of course, the entire front or plate supporting portion of the cathode-conveyor member shall be of copper or other suitable electroconductive metal such that there is the desired uniform distribution and transmissions of current to the plate as it passes the plating head. Uniformity of current distribution is highly desirable and generally necessary in order to preclude "hot spots" with respect to the carried steel plate member and any disfigurations with respect to the desired copper plating onto the surface of the plate.

In connection with effecting the electrodeposition of copper on stainless steel caul plates, it is also deemed to be of advantage to have a somewhat rough or nodulized copper surface to the resulting electrodeposition in order to provide for an easier and better transfer of the copper surface from the caul plate to the epoxy coating of a laminate board during the heating and pressing of the plurality of prepreg sheets into cured rigid, laminate form, copper clad circuit board. Thus, a modified procedure and operating system will incorporate two plating heads or at least two anode arrangements such that a first anode will serve to effect an initial copper plating onto the steel plate under conditions of plating solution turbulence and current flow such that a relatively smooth electrodeposition will take place. The second stage anode will effect a second electroplating operation under conditions of less solution turbulence or agitation and, also, with a possible different electrical energy input such that a nodular-form copper deposition will take place on the initial copper plating. The less smooth, nodular coating will, as hereinbefore noted, provide enhanced transfer characteristics in effecting the ultimate removal of the copper deposition from the stainless steel plate to the resulting laminate board.

In still another modification of the basic continuous operating plating system, there may be the provision of an additional plating head, or plating heads, downstream from the initial plating station, with respect to plate movement, and in a position on the opposing side of the plate with respect to the initial plating station so as to provide a resulting operation where there is a coating on both sides of the plate members.

Reference to the accompanying drawings and the following descriptions thereof will serve to illustrate an embodiment of the present improved operation and an apparatus system for carrying out the continuous plating procedure, as well as serve to set forth advantageous features incorporated in the present invention.

FIG. 1 of the drawing is a diagrammatic plan view illustrating means to carry a sequence of plate members to a plating station and pass them therethrough between fixed position anode means and a plurality of interlinked movable cathode-conveyor members.

FIG. 2 of the drawing is a partial sectional elevational view through the plating head portion of the apparatus indicating the arrangement of anode means within a box-like plating head and, in addition, indicates means for supporting and moving the plurality of the cathode-conveyor members past the plating head area in a manner such that each plate member is carried substantially vertically past the anode member while being subjected to contact with the plating solution.

Figure 3:
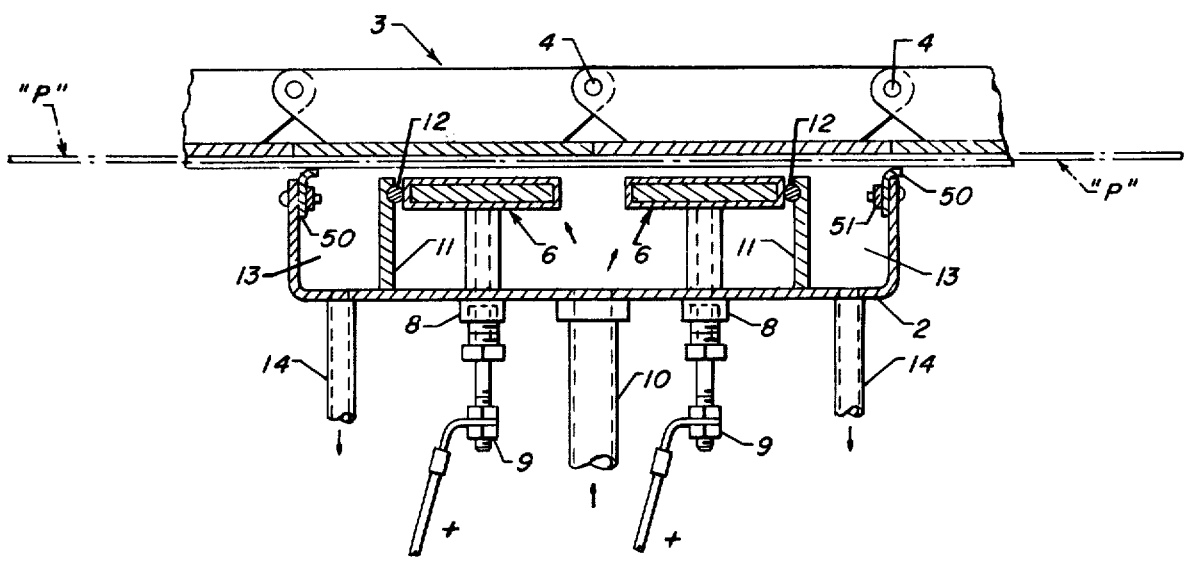

FIG. 3 of the drawing is a partial sectional plan view through the plating head shown, as indicated by the line 3-3 in FIG. 2.

FIG. 4 of the drawing indicates in a diagrammatic partial sectional view the arrangement of guide roller means such as used ahead of and downstream from the plating station which will serve to carry the sequence of plates to the cathode-conveyor members and to the plating station.

FIG. 5 of the drawing indicates a partial plan view of the utilization of two side-by-side plating heads such that a first head may serve to provide an initial copper coating and a second plating head will serve to deposit a nodular form of copper deposition.

Referring now particularly to FIG. 1 of the drawing, there is indicated diagrammatically a plating head or station generally at 1 with such plating head comprising an open-backed, box-like housing section 2 capable of retaining a flowing electrolyte or plating solution which will be in contact with plates to be carried on the opposing and adjacent movable cathode-plate conveyor members 3. As will be illustrated in other figures, adjacent cathode-plate conveyor members 3 are interlinked one to another by suitable pin means such as at 4, to be in an endless loop of a plurality of members and this loop of members is connective with poweroperated belt means or gear means such that they can be moved in a continuous loop path or carousel type of manner. Each cathode member will also have a suitable shelf or lower ledge means, such as at 5, to assist in carrying the sequence of plate members to be coated past the plating head 1. Current is supplied to terminal means, as indicated at 46, to each of the movable cathode-plate conveyor members from a central source such that current can be transmitted to the back side of each plate being conveyed to, in turn, provide for current flow between an anode and a cathode at the plating head to effect the desired electrodeposition of copper onto a vertical strip of plate member as the plate is conveyed past the plating head.

Within the plating head 1 and its box-like housing 2, there shall be at least one vertically extending anode member 6 to provide for current distribution through the electrolyte passing between the anode and the plate surface. Actually, in the embodiment of FIG. 1, there are indicated two vertically extending anode members 6 and each is provided with one or more rod portions 7 which will extend through packing gland sections 8 and have suitable terminal means at 9 to provide for electric current input to the anode. The present embodiment also indicates the use of electrolyte inlet means at 10 which is centrally positioned with respect to the anode members 6 and the plating solution housing 2 such that there will be an intermediate distribution of plating solution around the outer faces of the anode members 6 and against the faces of the sequence of plate members which will be conveyed past the plating head. The arrangement results in the electrolyte being constantly maintained in a turbulent flow between the anode members 6 and the caul plate on cathode members 3. There are also indicated diagrammatically the use of partitioning members 11 vertically along interior side portions of the housing 2, as well as seal members 12 between such members 11 and the outer edges of anodes 6 so that plating solution can only flow around the outer faces of anode members 6 to reach side discharge zones 13 and outlet conduits 14.

It is also to be noted that FIG. 1 of the drawing, as well as FIG. 4, indicates the use of guide rollers 15 and 16 upstream from the leading station (when considering plate movement through the system to be in a left-to-right motion). There are also indicated guide rollers at 17 and 18 downstream from the plating head 1. These guide rollers together with guide bars or roller means for the top of the plates (not shown) will serve to carry the sequence of plate members from a washing station or other plate preparation area to the present plating station and at the same time convey resulting plated members from the plating station to a downstream area for storage or for further processing. Each of the guide rollers will, of course, be supported on suitable rotating shaft means such as 15', 16', 17', and 18' which, in turn, are maintained in suitable positioning by support bearings 15'', 16'', 17'' and 18''. The guide rollers 15 are indicated to be power driven through sprocket means 19 and link chain 20 while roller means 16 is indicated as merely being an idling roller. The power driven rollers will, of course, assist in the movement of the sequence of plate members to the plating station; and in a similar manner, the power driven rollers 18 downstream from the plating station serve to contain the sequential movement of the plates from such station in a power-operated motion. Preferably, the rollers 15 will be turned slightly faster than the power driven rollers 18 so as to insure the tight, abutting feed of the sequence of plates to the plating station.

In FIG. 4 of the drawing, there is indicated diagrammatically the alignment of the guide roller means 16 with the lower portion of a cathode-conveyor member 3 and in particular a generally horizontal alignment with the upper edge of the shelf portion 5 such that there can be the transfer of the plates to the shelf 5 and has such plates rest against the face portion 3 of the cathode-conveyor member. The rollers and their respective supporting bearings are in turn indicated as being attached to and supported from longitudinal extended structural members 21 and 22, while a sprocket means 19 connective with link chain 20 is connective with an adjustable gear reducing mechanism at 23 which, in turn, is in connection with motor means not shown. It is to be realized that the conveying rollers, their power operation, etc., are merely diagrammatic and that various types of conveyor means and roller means may be utilized in effecting the feeding of the sequence of plates to be coated to the plurality of cathode-conveyor members and to the plating station 1. It is also a principal feature of the present invention to provide plate feeding means which will bring each of the sequence of plates to the plating station in a substantially vertical orientation whereby they will pass the plating head, or heads, in a substantially vertical manner and be subject to copper plating in a vertical strip manner while there is continuous movement of each plate member past the plating head. In order to assist in the loading of each caul plate and to prevent tipping of each plate member from the supporting cathode-conveyor, the apparatus arrangement can provide that each of the cathode-plate conveyor members will have a slight angle of tipping with respect to a vertical line such that each plate member will readily rest against the conductive surface 3' of each conveyor member 3. At the same time, the entire plating head and solution retaining housing 2, as well as internal anode members 6, will be tipped to be parallel with the cathode members 3.

As better shown in the somewhat enlarged and partial cross-sectional view of FIG. 2, it will be noted that the plurality of interlinked cathode-conveyor members 3 are maintained at a slight angle with respect to a vertical plane by having lower support rollers 24 from bearings 25 and bar members 26, as well as having upper horizontal guide rollers 27 extending from upper horizontal bar sections of the cathode-conveyor members 3. The lower rollers 24 are arranged to carry and transfer the weight of the cathode-conveyor members, as well as steel plate members which they may be carrying, onto a suitable loop-form track means 29 which, in turn, is part of a sloping support framing for the overall plurality of interlinked cathode-conveyor members. An additional continuous loop-form guide band 30 is provided in connection with the upper framing portion for the unit to serve as a guide means for the plurality of rollers 27 at each linking point of the cathode-conveyor members (lower link point not shown) such that the entire plurality of interlinked members 3 can be moved in a guided continuous loop movement past the plating station 1.

Although various types of supporting arrangements may be made as well as various types of driving mechanisms utilized to effect the continuous movement of cathode-conveyor members 3, there is indicated diagrammatically in the present FIG. 2 the utilization of sprocket means and link chain means connective with a central shaft 31 and also the use of one or more auxiliary vertical shaft means such as at 32. The central shaft 31 is indicated as being supported from suitable structural framing and spaced bearing means at 33, 34 and 35. Motive power is shown as supplied from a lower sprocket member 36 connective through link means 37 to a sprocket means 38 extending from a gear reducer box 39 which, in turn, will be connective to suitable motor means not shown. An intermediately positioned sprocket 40 is connective through link chain member 41 to a sprocket means 42 on shaft 32 such that the latter is turned at a desired rate to move sprocket means 43 which engages suitable toothed sections or a continuous link chain 45 fixedly mounted longitudinally on each of the back portions of each cathode-conveyor member 3 and thus forming a continuous toothed loop.

In FIG. 2, as well as in FIG. 1, it will be noted that the upper end portion of each current carrying cathode-conveyor member 3 is provided with electrical terminal means at 46 such that there may be the desired continuous flow of current between the anode and cathode members of the plating apparatus. Also, as best shown in FIG. 2, the upper end portion of the central shaft 31 is provided with a cable supporting wheel 47 and a current distributing arrangement at 48 so that cables 49 extending therefrom to each individual cathode-conveyor member will receive current for the desired electroplating operation. The current distributor portion 48 may, for example, utilize a small mercury containing chamber which is insulated from shaft 31 and will serve to distribute the current from a supply cable 44 to each distributing cable 9. However, other suitable means for distributing the current to the respective cables may be embodied in the apparatus and it is not intended to limit the invention to any one current transmitting system. In operation, the shaft 31 and the upper wheel 47 together with the supported cables 49 will be geared so as to turn at a speed correlated with the movement of the plurality of cathode members 3 as they are continuously moved in the loop-form path past the plating station.

As may be noted, FIG. 2 of the drawing, as well as the sectional plan view FIG. 3, provide somewhat enlarged views of the plating head and the anode means therein in comparison to the plan view of FIG. 1; however, the various parts showing in the different views have been provided with the same designating numerals, with the housing 2 showing internal spaced anode members 6 extending through the front wall of the chamber 2 through packing gland means 8 and having cable terminal means 9 connect to suitable cable means such that there may be a current supply to each of the spaced anodes 6. A single plating solution inlet 10 is shown as being centrally positioned while plating solution withdrawal conduits 14 are indicated as being provided along each side portion of the housing or containment means 2. As best shown in FIG. 3, there is also indicated the provision of spaced baffling or partitioning members 11 within the interior of housing 2 in spaced positions along the exterior edge portions of each of the spaced anodes 6, whereby seal means 12 can be provided along each outer edge portion of the anode 6 to preclude fluid flow behind the anode members. In other words, the plating solution is forced to pass in a prescribed flow in the central portion of the containment outwardly to the open face portion thereof and past the exterior faces of the anode members 6 to reach withdrawal zones 13 and then be discharged by way of the outlet conduits 14. As a result, the plating solution flows between the outer faces of the anode 6 and the front face of a plate member (indicated by the dashed lines "P"). Preferably, the flow of the solution will be such that it is in a rapid turbulent flow as it passes through the narrowed zone in order to provide a uniform smooth metal deposition onto the face of the plate "P". A preferred apparatus arrangement will permit the in and out positioning of the anode members 6 such that the spacing between their outer faces and the face of the plate "P" will, in turn, be adjusted to regulate fluid flow and to modify plating characteristics with respect to the electrodeposition of the copper, or other metal plating.

In FIG. 3 of the drawing, there are indicated suitable seal members 50 along each vertical side portion of the housing 2, with such seal members being of rubber or other flexible material formed into strip seals such that they will retain contact with the moving faces for each of the plates "P" passing by the plating station. As an alternative, vertical rubber coated roller members could be used along each vertical side portion to form pressure exerting seal members. The seal members 50 are indicated as being removably bolted to the containment means by backup strips 51; however, other suitable attachment means may be utilized in connection with the plating head. Also, as best shown in FIG. 2, upper and lower seal members 52 are shown as being removably attached to the respective upper and lower edge portions of the containment housing 2 such that each seal member 52 will provide a flexible contact with upper and lower edge portions of the cathode-conveyor means 3. In other words, upper seal member 52 is positioned to contact an upper horizontal strip member 53 while a lower seal member 52 contacts the face of the lower plate supporting shelf member 5. The respective seal members are also indicated as being removably attached to the container 2 by removable strip members 54; however, again other suitable seal ring attachment means may well be utilized within the scope of the present invention.

It is recognized that during the operation of the system, there may be some leakage of plating solution from around the side seals 50 and the upper and lower seal members 52 and that such solution leakage will run down the face of the moving plate members "P"; however, in the present embodiment there is indicated diagrammatically the use of a liquid collection pan 55 which will, as shown in FIGS. 1 and 2, extend under the entire area of the plating head so as to collect any liquid leakage or spillage. FIG. 2 of the drawing also indicates that the liquid collecting tray 55 will dischrge through a drain opening 56 into an electrolyte reservoir 57. The latter is indicated as having a withdrawal means in the lower portion thereof at 58 such that solution may be continuously pumped from such reservoir into the plating head inlet means 10 for distribution through the interior containment 2 for the plating head and around the anode means 6. Although not shown in any detail in the drawing, it is to be understood that conventional and suitable pumping means will be provided to maintain a continuous flow of the liquid from reservoir means 57 by way of conduit outlet means 58 to connect with the inlet means 10 and that suitable control valve means may also be incorporated with the conduit means and the pumping means to provide for the regulation of the rate of flow for the elctrolyte solution. FIG. 2 also shows diagrammatically that the solution outlet means 14 can connect through conduit means 14' to the upper portion of the reservoir chamber 57 to complete the cycle of the flow of the electrolyte through the plating head and back to a reservoir section 57. A small drain hole 59 is shown within the lower edge portion of container 2 so that all solution may flow from the plating head during such periods that the entire plating system is shut down, with the drainage from passageway means 59 passing into the interior tray 55 to then flow through the opening 56 into reservoir 57.

It is to be understood that all of the drawings are diagrammatic and that there may be variations in construction and arrangement as well as with respect to detail and operation of the present apparatus system and that such system should not be limited strictly to the arrangements and details indicated in the present drawing. Many obvious variations may be provided in effecting the support of each portion of the system as well as providing movement of the various movable parts of the system. For example, various types of roller support means may be provided to effect the guidance and movement of each of the interlinked cathode-conveyor members and various types of seal means may be utilized to generally contain the plating solution within the plating head while at the same time provide an open face of the containment means or housing 2 to permit contact of the plating solution with each of the movable plates being conveyed past the plating head. There may be variations in the design and construction of the anode members as well as cathode members; however, as heretofore noted, it is a feature of the present invention to utilize at least one elongated vertically positioned anode within each plating head and an opposing moving cathode current distributing means extending for the full height of each plate as it is carried past the plating head such that there may be a continuous plating of a full vertical height strip on each plate member as it is conveyed past the plating head. It is also a feature of the present invention to provide an arrangement where the plate members may be brought to the plating station in a generally vertical orientation and be transferred to the cathode-plate conveyor means which is also constructed and arranged to be in a substantially vertical position. However, as indicated in the present drawings, a preferred arrangement may well utilize a slight tipping or angular positioning for the cathode-conveyor members as well as for the plating head such that the sequence of plates moving through the plating station will be more readily obtained in a full flat contact against the cathode members, without a tendency to waiver or fall away from the cathode-conveyor.

With respect to the anode members 6, they are indicated as being somewhat adjustable as to their in-and-out positioning by virtue of clamping means combined with the backing arrangements at 8 where rod portions carry through the wall of the containment 2 to the outer terminal means 9. Typically, each anode member 6 will have more than one rod element carrying through to outer terminals 9 in order that there be uniform and efficient current distribution to the inner flat face portion of each anode 6 with the number of distributing rods and terminal means 9 depending on the height of each anode member 6. The present embodiment indicates the utilization of two side-by-side anodes 6; however, in certain plating units, it may be possible that a single anode may suffice in providing adequate current distribution through the plating solution with respect to the back-up cathode means and for the plate member to be moved between the electrodes of the unit. As heretofore noted, each electrode 6 will, of necessity, be constructed of suitable material to withstand the plating solution and maintain a generally long life of operation. The present embodiment indicates a covering metal over an internal core section, such as the utilization of cast lead over an internal core section of copper where the operation is to utilize a copper sulfate-sulfuric acid solution for effecting the copper plating of stainless steel plates.

In FIG. 5 of the drawing, there is indicated diagrammatically the utilization of two separate plating heads, with a first plating head 60 having anode means 61 and solution inlet and outlet means, indicated respectively as 62 and 63, available to provide an initial copper deposition onto a sequence of moving plates carried by the interlinked cathode-conveyor members 64. In addition, there is indicated a second plating head at 65 with its internal anode means 66 and respective conduit means 67 and 68 to provide for the flow of the plating solution through the plating head and against the plate means being carried by the cathode-conveyor means 64 as each plate being carried by such means moves in a left-to-right direction, whereby there can be a resulting second electrodeposition of copper plating onto each of the plates as they move sequentially through the system. In the two-zone plating system, there will be an initial relatively smooth deposit of copper onto each steel plate and then a second less smooth plating of nodular-form copper such that there is a rougher resulting surface from the copper plating operation. As heretofore indicated, the less smooth nodular plating operation results in a surface which is more readily lifted from each coated caul plate in the pressing and forming of laminate type circuit boards. In other words, the rough nodular coating provides better bonding with the resin or epoxy coatings for the prepreg sheets of the laminate board and a rapid easy transfer of the copper plating from the steel plates to the resulting copper clad rigid laminate boards. Where desired, the initial plating and the nodular plating may be accomplished in divided sections of one large plating head, rather than within two distinctly separate heads or containment zones as indicated in FIG. 5 and it is not intended to limit the movement system to any one particular construction and arrangement. Typically, the electrolyte flow in the downstream nodular plating operation will be less turbulent than the flow maintained in the initial zone such that there is a greater tendency for the nodular deposition of copper onto the plates being coated. Also, the current intensity may be somewhat different for the second step of the coating versus that of the first step of the coating.

I claim as my invention:

1. A continuous automatic method for effecting the plating of a thin copper coating onto a steel plate, which comprises the steps of:
    a. conveying a cleaned steel plate in a generally vertical position to a plating station and transferring such plate to movable generally vertical cathode-conveyor means providing a current conducting face for supplying electrical current uniformly to the back side of said plate as it passes the plating station,
    b. supplying a copper containing electrolyte solution into contact with a vertical strip portion of said steel plate from a containment zone with an open portion maintained against the face of the moving plate to be coated while simultaneously supplying electric current to said cathode-conveyor means and to an anode means positioned to be maintained closely adjacent substantially the full height of a strip of the front face of the steel plate from within said electrolyte containment zone,
    c. with said supply of electrolyte solution to said containment zone and the withdrawal of solution therefrom providing turbulent electrolyte flow between the spaced faces of the anode and the steel plate during the plating operations, and
    d. continuously withdrawing and conveying away the resulting copper coated steel plates as they are passed by the anode means and leave the plating station.

2. The continuous plating method of claim 1 further characterized in that separate additional anode means is provided within an additional electrolyte containment zone which is maintained downstream of first said electrolyte containment zone, with respect to movement of the steel plates to be coated, thereby providing an additional plating step for the electrodeposition of copper onto the initial coating effected in the first set of electrolyte containment zone and control of fluid passage by said additional anode means maintained therein, whereby a nodular form of copper plating may be formed on the plate being coated when passing said additional anode means.

3. Apparatus for effecting a copper plating to one side of a sequence of separate stainless steel plates, which comprises in combination:
    a. conveyor means for holding the plates to be coated in a generally vertical position and for sequentially conveying separate plates to and from a plating station,
    b. a plurality of separate cathode-plate conveyor members that are interlinked to form an endless loop of members that are movably mounted on a supporting and guiding track means so as to be continuously movable in generally vertical positioning around a loop path opposing said plating station, with each such cathode-conveyor member having at least a lower projecting support means to support and move said plates as they reach the plating station and, additionally, having an electrically conductive surface to be in contact with the back portion of the plate being plated, and to conduct electric current thereto,
    c. motive power means connective to said interlinked cathode-conveyor members to move them on said track means,
    d. a box-like plating head with an open side portion to face the conveyed plates and distribute electrolyte into contact with one face thereof, said plating head also encompassing a vertically elongated anode therein that is positioned to be maintained at a spaced distance from a vertical strip portion of each steel plate as it is sequentially conveyed by said station, and said plating head further having at least upper and lower liquid holding seal means to preclude the loss of the electrolyte along the upper and lower edges of the moving plates as they move past the plating head,
    e. electrolyte distributing means to said plating head to supply plating solution to said plating station and into contact with each plate between said anode means and the plate as it is being moved past said head,
    f. electrolyte solution withdrawal means from said head,
    g. electrolyte solution collection means positioned below said plating station to collect electrolyte flows and leakages from around said plating head, and
    h. current suppling means connective with the anode means in the interior of said plating head and with each of the plurality of movable cathode-plate conveyor members whereby electric plating current can be supplied to the solution and to each steel plate as it passes the plating head for rapidly effecting a desired thin copper plating to one side of each such plate.

4. The apparatus of claim 3 further characterized in that said anode means within the interior of said plating head is adjustably held as to its positioning in said head with respect to distance from said cathode-conveyor members and plates which are carried thereon.

5. The apparatus of claim 3 further characterized in that at least one current carrying cable means is connective to each of the plurality of cathode-plate conveyor members and a rotatable support means is provided for holding each of said cable means in a manner such that the latter will move in a synchronized manner with the movement of the plurality of cathode-conveyor members as they move in the loop path, and current distribution means is provided to each of said cable means such that current will be distributed to each of the plurality of separate movable cathode-plate conveyor members.

6. The apparatus of claim 3 further characterized in that the cathode-plate conveyor members are positioned and movably supported in a manner to have a slight tilt from a vertical at the plating station opposing said plating head and the latter together with the anode means therein are also tilted to oppose and be parallel with said cathode-conveyor members.

7. The apparatus of claim 3 further characterized in that said plating station is provided with two box-like plating heads in a side-by-side relationship with each of such heads having separate vertically extending anode means to oppose the moving cathode-conveyor members and fluid inlet and outlet means are provided for each of the plating heads such that there may be the separate introduction of electrolyte solution to each of the separate heads to permit separate and individual flow characteristics past the anodes in the respective heads such that a second stage coating will be accomplished over an initial deposition within such head that is downstream from the first, with respect to the movement of plate members.

8. The apparatus of claim 3 further characterized in that said conveyor means for holding the plates and sequentially conveying such plates to and from the plating station incorporates power-operated roller means to fit below the lower edge portions of the plates to assist in the movement of plates to said station and to further assist in the removal of plates as they leave the plating station.

9. The apparatus of claim 8 still further characterized in that the power-operated roller means as part of the conveyor means feeding the plates to the plating station are operative to move at a speed somewhat greater than the power-operated rollers for the conveyor means which assist in conveying the plates away from the plating station.

10. The apparatus of claim 3 further characterized in that current regulating means connects with the power source to said anode means and to said cathode-conveyor members to provide for the regulation of current input with the anode and cathode means to in turn regulate rates of electrodeposition of copper to the steel plate members as they are conveyed past the plating station.

* * * * *